United States Patent
Lin et al.

(10) Patent No.: US 10,703,945 B2
(45) Date of Patent: Jul. 7, 2020

(54) METHOD FOR TEMPORARY BONDING WORKPIECE AND ADHESIVE

(71) Applicant: Daxin Materials Corporation, Taichung (TW)

(72) Inventors: Chi-Yen Lin, Taichung (TW); Cheng-Wei Lee, Taichung (TW); Chun-Hung Huang, Taichung (TW); Hou-Te Lu, Taichung (TW); Yuan-Li Liao, Taichung (TW)

(73) Assignee: Daxin Materials Corporation, Taichung (TW)

( * ) Notice: Subject to any disclaimer, the term of this patent is extended or adjusted under 35 U.S.C. 154(b) by 0 days.

(21) Appl. No.: 16/393,950

(22) Filed: Apr. 24, 2019

(65) Prior Publication Data

US 2019/0330504 A1    Oct. 31, 2019

(30) Foreign Application Priority Data

Apr. 25, 2018   (TW) .............................. 107114075 A

(51) Int. Cl.
    *C09J 179/08*    (2006.01)
    *B32B 37/12*    (2006.01)
    (Continued)

(52) U.S. Cl.
    CPC ............. *C09J 179/08* (2013.01); *B32B 37/12* (2013.01); *B32B 43/006* (2013.01); *C09J 5/00* (2013.01);
    (Continued)

(58) Field of Classification Search
None
See application file for complete search history.

(56) References Cited

U.S. PATENT DOCUMENTS 9,324,601 B1    4/2016    Allen et al.
2007/0090299 A1    4/2007    Kozakai et al.
(Continued)

FOREIGN PATENT DOCUMENTS

JP    2005120269 A    5/2005
JP    5040247 B2    10/2012
(Continued)

OTHER PUBLICATIONS

K. Zoschke et al., "Polyimide based Temporary Wafer Bonding Technology for High Temperature Compliant TSV Backside Processing and Thin Device Handling", 2012 IEEE 62nd Electronic Components and Technology Conference, dated on May 29-Jun. 1, 2012, pp. 1054-1061, United States.

*Primary Examiner* — J.E. Schoenholtz
(74) *Attorney, Agent, or Firm* — CKC & Partners Co., LLC

(57) ABSTRACT

A method for temporary bonding workpiece includes steps as follows. A combining step is performed, wherein an adhesive layer is formed on a surface of at least one substrate and/or at least one workpiece. A bonding step is performed, wherein the substrate and the workpiece are bonded by the adhesive layer. A processing step is performed, wherein the workpiece is processed. A debonding step is performed, wherein the adhesive layer is irradiated with a laser so as to separate the workpiece from the substrate. The adhesive layer is formed by an adhesive, the adhesive includes a polymer and a light absorbing material, a content of the polymer in a solid content of the adhesive is in a range of 50 wt % to 98 wt %, a content of the light absorbing material in the solid content of the adhesive is in a range of 2 wt % to 50 wt %.

17 Claims, 8 Drawing Sheets

(51) Int. Cl.
 *B32B 43/00* (2006.01)
 *C09J 5/00* (2006.01)
 *H01L 21/683* (2006.01)

(52) U.S. Cl.
 CPC ...... *H01L 21/6836* (2013.01); *B32B 2457/14* (2013.01); *C09J 2205/302* (2013.01); *C09J 2205/31* (2013.01); *C09J 2479/08* (2013.01); *H01L 2221/68372* (2013.01); *H01L 2221/68381* (2013.01)

(56) References Cited

U.S. PATENT DOCUMENTS

| | | |
|---|---|---|
| 2013/0288058 A1 | 10/2013 | Hong et al. |
| 2014/0057450 A1* | 2/2014 | Bourbina ............ H01L 21/6835 438/759 |
| 2017/0101555 A1* | 4/2017 | Yasuda ...................... C09J 5/00 |
| 2017/0221746 A1* | 8/2017 | Arimoto ................ C08K 5/544 |

FOREIGN PATENT DOCUMENTS

| | | |
|---|---|---|
| JP | 5040252 B2 | 10/2012 |
| JP | 5103870 B2 | 12/2012 |
| JP | 5130939 B2 | 1/2013 |
| JP | 5141366 B2 | 2/2013 |
| JP | 2017098474 A | 6/2017 |
| TW | I393758 B | 4/2013 |
| TW | 201522045 A | 6/2015 |
| TW | 201546231 A | 12/2015 |
| TW | 201610063 A | 3/2016 |

\* cited by examiner

US 10,703,945 B2

METHOD FOR TEMPORARY BONDING WORKPIECE AND ADHESIVE

RELATED APPLICATIONS

This application claims priority to Taiwan Application Serial Number 107114075, filed Apr. 25, 2018, which is herein incorporated by reference.

BACKGROUND

Technical Field

The present disclosure relates to a method for temporary bonding workpiece and an adhesive. More particularly, the present disclosure relates to an adhesive with laser debond and a method for temporary bonding workpiece thereof.

Description of Related Art

With the thinning of the semiconductor devices, the temporary bonding/debonding technology is become one of the important technologies in the recent years. Because the thinned elements is fragile and unsupported that should be bonded with the support substrate by the method for temporary bonding workpiece (i.e. wafer), so as to perform the subsequent processing, such as wiring, joining metallurgy, to the workpiece. After the processing, the temporary bonding adhesive is removed to separate the workpiece from the support substrate. Since the semiconductor processes often require the operating conditions of the high temperature, for example, soldering or reflow are performed at the temperature higher than 250° C. Therefore, in addition to the excellent adhesion, the temporary bonding adhesive needs the heat resistance and the removability. Thereby, during the processing, the workpiece can be fixed stably on the support substrate by the temporary bonding adhesive, and can withstand the operating condition of the high temperature of the semiconductor process, then can be debonded and cleaned easily after the processing is finished.

Therefore, how to improve the formulation of the temporary bonding adhesive and the appropriate debonding method, so that the temporary bonding adhesive has the excellent adhesion, the heat resistance and the removability, and is favorable for cleaning for the workpiece is the goal of the relevant industry.

SUMMARY

According to one aspect of the present disclosure, a method for temporary bonding workpiece includes step as follows. A combining step is performed, wherein an adhesive layer is formed on a surface of at least one substrate and/or at least one workpiece. A bonding step is performed, wherein the substrate and the workpiece are bonded by the adhesive layer. A processing step is performed, wherein the workpiece is processed. A debonding step is performed, wherein the adhesive layer is irradiated with a laser so as to separate the workpiece from the substrate. The adhesive layer is formed by an adhesive, the adhesive includes a polymer and a light absorbing material, a content of the polymer in a solid content of the adhesive is in a range of 50 wt % to 98 wt %, a content of the light absorbing material in the solid content of the adhesive is in a range of 2 wt % to 50 wt %, the polymer is polyimide or a copolymer of amic acid/imide, a content of a hydroxyl-containing unit of a skeleton of the polymer is in a range of 5 wt % to 45 wt %, a content of an aliphatic ether-containing unit or a siloxane-containing unit of the skeleton of the polymer is in a range of 5 wt % to 40 wt %, and a cyclization ratio of the polymer is greater than or equal to 90%.

According to another aspect of the present disclosure, an adhesive is provided. The adhesive includes a polymer and a light absorbing material. A content of the polymer in a solid content of the adhesive is in a range of 50 wt % to 98 wt %, the polymer is polyimide or a copolymer of amic acid/imide, a content of a hydroxyl-containing unit of a skeleton of the polymer is in a range of 5 wt % to 45 wt %, a content of an aliphatic ether-containing unit or a siloxane-containing unit of the skeleton of the polymer is in a range of 5 wt % to 40 wt %, and a cyclization ratio of the polymer is greater than or equal to 90%. A content of the light absorbing material in the solid content of the adhesive is in a range of 2 wt % to 50 wt %.

BRIEF DESCRIPTION OF THE DRAWINGS

The present disclosure can be more fully understood by reading the following detailed description of the embodiment, with reference made to the accompanying drawings as follows.

DETAILED DESCRIPTION

Figure 1:
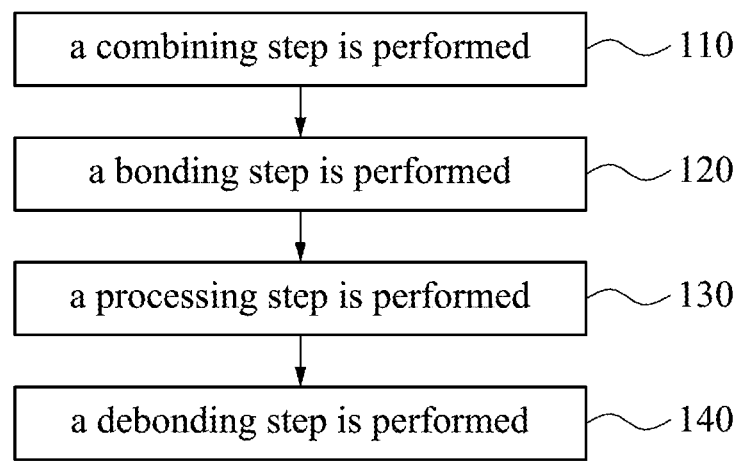
FIG. 1 is a flow chart of a method for temporary bonding workpiece according to one embodiment of the present disclosure.

In the present disclosure, if a group is not indicated specifically which is substituted or not, the group can be represented the substituted or unsubstituted group. For example, "alkyl group" can be represented the substituted or unsubstituted alkyl group. Furthermore, when a group is described by "$C_x$", it indicates that the main chain of the group has X carbon atoms.

In the present disclosure, the compound structure is represented by a skeleton formula sometimes, and the representation can omit the carbon atom, the hydrogen atom and the carbon-hydrogen bond. In the case that the functional group is depicted clearly in the structural formula, the depicted one is preferred.

In the present disclosure, the range represented by "a numerical value to another numerical value" is a schematic representation that avoids enumerating all the numerical values in the range of the specification. Therefore, the recitation of a particular range of numerical values includes any numerical value in the range of the numerical values and the smaller range of numerical values defined by any numerical value in the range of numerical values. As stated in the specification, the range of any numerical value is the same as the range of the smaller numerical value. For example, the range of "0.1 wt % to 1 wt %" includes the range of "0.5 wt % to 0.8 wt %" whether the specification is list other numerical values or not.

In the present disclosure, when the range of numerical values are described, for example, the cyclization ratio of the polymer is greater than or equal to 90%, which includes the following two cases: the cyclization ratio of the polymer is equal to 90%, and the cyclization ration of the polymer is greater than 90%.

An Adhesive

An adhesive is provided in the present disclosure, which includes a polymer, a light absorbing material and a solvent. Further, the adhesive can selectively include an additive.

A content of the polymer in a solid content of the adhesive is in a range of 50 wt % to 98 wt %, and a content of the light absorbing material in the solid content of the adhesive is in a range of 2 wt % to 50 wt %. The polymer is polyimide or a copolymer of amic acid/imide, and a content of a hydroxyl-containing unit of a skeleton of the polymer is in a range of 5 wt % to 45 wt %, a content of an aliphatic ether-containing unit or a siloxane-containing unit of the skeleton of the polymer is in a range of 5 wt % to 40 wt %, and a cyclization ratio of the polymer is greater than or equal to 90%. Therefore, the adhesive has the excellent adhesion, the excellent heat resistance and the excellent removability. Due to the excellent adhesion, the workpiece can be fixed stably on the substrate by the adhesive during the processing. Due to the excellent heat resistance, the adhesive is favorable for the high-temperature processes, and has the potential for applying to the semiconductor processes. Due to the excellent removability, the adhesive is removed easily from the workpiece after the processing finished. The aforementioned excellent removability includes a laser debond ability (hereinafter also referred to as a laser separation) and the washability after the laser debond. In addition, the adhesive according to the present disclosure can be baked into a film at the temperature lower than 250° C. so as to avoid the damage of the high baking film temperature to the element with temperature sensitive of the workpiece.

Preferably, the content of the polymer in the solid content of the adhesive can be in the range of 50 wt % to 95 wt %, which is favorable for improving the adhesion, the heat resistance and the removability of the adhesive. More preferably, the content of the polymer in the solid content of the adhesive can be in the range of 55 wt % to 90 wt %.

Preferably, the content of a hydroxyl-containing unit of the skeleton of the polymer can be in the range of 7 wt % to 40 wt %. Thereby, the solubility of the polymer can be further improved, which is favorable for improving the washability after the laser debond. More preferably, the content of a hydroxyl-containing unit of the skeleton of the polymer can be in the range of 9 wt % to 35 wt %.

The aforementioned hydroxyl-containing unit can be included but not limited to a structure represented by formula (I-1), formula (I-2), formula (I-3), formula (I-4) or formula (I-5):

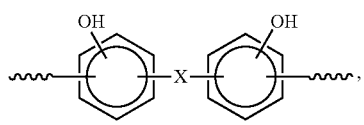

formula (I-1)

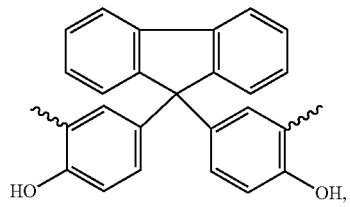

formula (I-2)

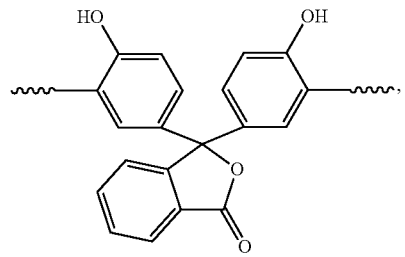

formula (I-3)

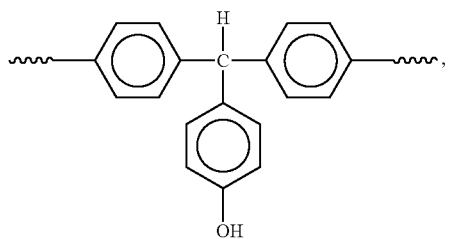

formula (I-4)

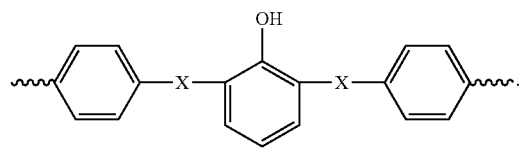

formula (I-5)

In formula (I-1) and formula (I-5), wherein each X is independently a single bond or a divalent organic group. For example, each X can be independently but is not limited to the single bond, a alkylene group of 1 to 4 carbon atoms, —CO—, —COO—, —O—, —SO$_2$— or C(CF$_3$)$_2$.

The aforementioned hydroxyl-containing unit can be provided by a reactant of the polymer, such as a diamine and/or a dianhydride. For example, formula (I-1) can be provided by the diamine of formula (I-1-1), formula (I-2) can be provided by the diamine of formula (I-2-1), formula (I-4) can be provided by the diamine of formula (I-4-1), formula (I-5) can be provided by the diamine of formula (I-5-1):

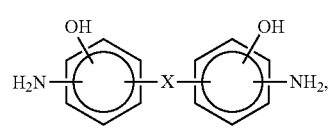

formula (I-1-1)

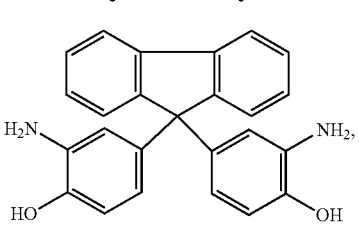

formula (I-2-1)

formula (I-4-1)

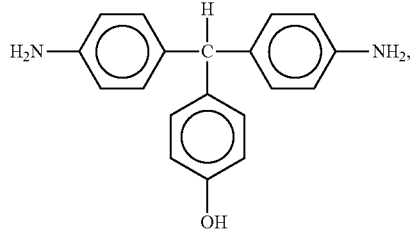

formula (I-5-1)

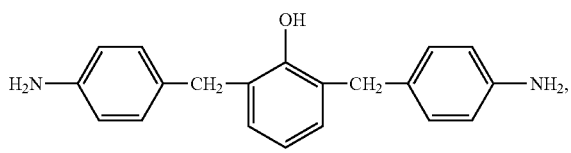

wherein the definition of X is as described in the aforementioned, and will not be further described herein.

Preferably, the content of an aliphatic ether-containing unit or a siloxane-containing unit of the skeleton of the polymer can be in the range of 5 wt % to 35 wt %. Thereby, the thermal compression bonding adhesion can be further improved. More preferably, the content of the aliphatic ether-containing unit or the siloxane-containing unit of the skeleton of the polymer can be in the range of 10 wt % to 35 wt %.

The aforementioned aliphatic ether-containing unit can be a poly aliphatic ether unit, whereby, the thermal compression bonding adhesion can be further improved. The poly aliphatic ether unit can be included but not limited to a segment represented by formula (II-1) or formula (II-2):

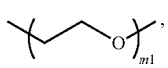

formula (II-1)

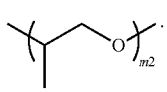

formula (II-2)

In formula (II-1), m1 can be an integer from 1 to 22. In formula (II-2), m2 can be an integer from 1 to 22.

The aforementioned aliphatic ether-containing unit can be provided by the reactant of the polymer, such as the diamine and/or the dianhydride. For example, formula (II-1) can be provided by the diamine of formula (II-2-1), formula (II-2) can be provided by the diamine of formula (II-2-1) or the triamine of formula (II-2-2):

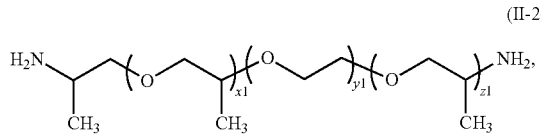

(II-2-1)

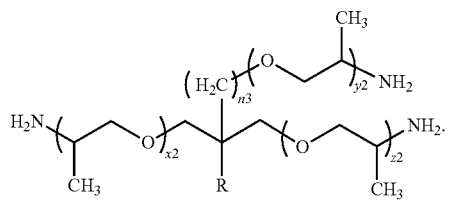

(II-2-2)

In formula (II-2-1), x1+y1+z1 can be an integer from 1 to 22. In formula (II-2-2), x2+y2+z2 can be an integer from 1 to 22, R can be a monovalent alkyl group, n3 can be an integer from 1 to 3. More specifically, for example, formula (II-2-2) can be provided by the product name JEFFAMINE T-403, that R is an ethyl group, x2+y2+z2 can be an integer from 5 to 6, n3 is 1, and the average weight molecular weight (MW) is about 440.

The aforementioned siloxane-containing unit can be a polysiloxane unit, whereby, the thermal compression bonding adhesion can be improved. The polysiloxane unit can include but not limited to a segment represented by formula (III-1):

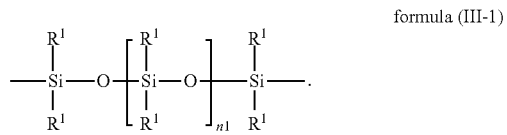

formula (III-1)

In formula (III-1), each $R^1$ is independently a methyl or a phenyl, n1 is an integer from 0 to 5.

The aforementioned siloxane-containing unit can be provided by the reactant of the polymer, such as the diamine and/or the dianhydride.

Preferably, the content of the light absorbing material in the solid content of the adhesive is in the range of 5 wt % to 47 wt %. Therefore, the laser debond ability can be further improved. More specifically, the content of the light absorbing material in the solid content of the adhesive is in the range of 7 wt % to 47 wt %.

The aforementioned light absorbing material can be carbon black, titanium black, iron oxide, titanium nitride, an organic pigment or a dye.

A Method for Temporary Bonding Workpiece

Please refer to FIG. 1, which is a flow chart of a method for temporary bonding workpiece 100 according to one embodiment of the present disclosure. As shown in FIG. 1, the method for temporary bonding workpiece 100 includes a step 110, a step 120, a step 130 and a step 140.

In the step 110, a combining step is performed, wherein an adhesive layer is formed on a surface of at least one substrate and/or at least one workpiece. The adhesive layer is formed by an adhesive. The adhesive can refer to the aforementioned paragraph, and will not be described herein.

In the step 120, a bonding step is performed, wherein the substrate and the workpiece are bonded by the adhesive layer. For convenience of explanation, the structure in which the substrate and the workpiece bonded by the adhesive layer is a joint structure hereafter. The step 120 can be achieved by thermal compression bonding, that is, the workpiece, the adhesive layer and the substrate are bonded by applying the temperature and the pressure. The temperature can range from the room temperature to 250° C., and the pressure can range from 0.5 kgf/cm$^2$ to 5 kgf/cm$^2$.

In the step 130, a processing step is performed, wherein the workpiece is processed.

In the step 140, a debonding step is performed, wherein the adhesive layer is irradiated with a laser so as to separate the workpiece from the substrate.

By the excellent adhesion, the excellent heat resistance and the excellent removability of the adhesive, the workpiece is favorable for fixing on the substrate temporarily of the method for temporary bonding workpiece 100 according to the present disclosure. That is, during the processing, the workpiece can be fixed stably on the substrate. Then, after the processing, the workpiece can be separated from the substrate easily, and the adhesive can be removed from the workpiece easily. Furthermore, the method for temporary bonding workpiece 100 according to the present disclosure is favorable for the high-temperature processes, thus the method for temporary bonding workpiece 100 according to the present disclosure can be used as the temporary bonding/debonding technology of the semiconductor. For example, the workpiece can be a wafer, and the substrate can be a support substrate. The required supporting force during the processing of the wafer is provided by the support substrate, the wafer can be prevented from being broken during the processing. Then, after the processing, the wafer is separated from the substrate. Moreover, the method for temporary bonding workpiece 100 according to the present disclosure, since the adhesive can be baked into a film at the temperature lower than 250° C. so as to avoid the damage of the high baking film temperature to the element with temperature sensitive of the workpiece. The aforementioned excellent removability includes a laser debond ability and the washability after the laser debond.

The aforementioned "an adhesive layer is formed on a surface of at least one substrate and/or at least one workpiece" means that the adhesive layer can be disposed on a surface of the substrate only, the adhesive layer can be disposed on a surface of the workpiece only, or the adhesive layer can be disposed on a surface of the substrate and a surface of the workpiece simultaneously. In addition, the number of the substrate and the number of the workpiece can be in a one-to-one relationship, a many-to-one relationship or a one-to-many relationship. In other words, the method for temporary bonding workpiece 100 according to the present disclosure, one substrate can be used to bear one workpiece, a plurality of substrates can be used to jointly bear one workpiece, or one substrate can be used to bear a plurality of workpieces simultaneously.

The aforementioned workpiece can be a chip, a wafer or a micro device for semiconductor manufacturing, wherein the micro device for semiconductor manufacturing can be but is not limited to the micro device obtained by a metallurgical treatment, such as depositing a multilayer structure on the wafer, wiring, and then cutting. The specific examples of the micro device can include but not limited to a field-effect transistor, an optical sensor, a logic chip, a Known Good Die (KGD), and the size of the micro device ranges from 1 micrometer to several millimeters.

The aforementioned substrate can be made of a glass, a silicon wafer, or other materials that can be penetrated by a laser.

The aforementioned laser can be a solid laser, such as a YAG laser, a ruby laser, a YVO$_4$ laser and an optical fiber laser, a liquid laser, such as a pigment laser, a gas laser, such as a CO$_2$ laser, an excimer laser, an Ar laser and a He—Ne laser, a semiconductor laser, a diode pump solid state laser (DPSSL), and a free electron laser, etc.

Figure 2:
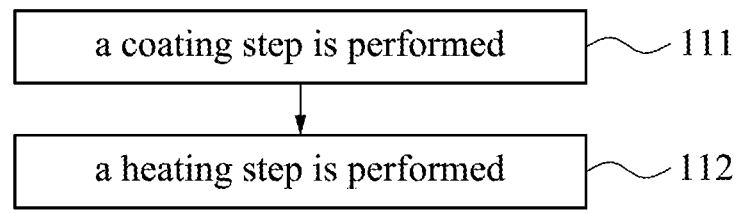
FIG. 2 is a flow chart of the step 110 in FIG. 1 according to one embodiment of the present disclosure.

Please refer to FIG. 2, which is a flow chart of the step 110 in FIG. 1 according to the present disclosure. In FIG. 2, the step 110 includes a step 111 and a step 112.

In the step 111, a coating step is performed, wherein the adhesive is coated on the surface of the substrate and/or the workpiece. The method of coating includes but not limited to the spin coating, the slit coating, the bar coating and the screen printing, etc.

In the step 112, a heating step is performed, wherein the adhesive is heated so as to convert the adhesive into the adhesive layer. The step 112 can be performed at the temperature of 50° C. to 200° C. for 0.5 hours to 2 hours, and the main purpose of the step 112 is removing some or all solvents of the adhesive. When the adhesive includes a copolymer of amic acid/imide, the cyclization of the amic acid segment can be promoted. When the adhesive includes a curable component, such as a crosslinker, the curing can be further promoted. Therefore, as long as the aforementioned purpose can be achieved, the temperature and the time of the step 112 can be adjusted appropriately according to the actual demands such as the type of solvent, the amount of solvent and the degree of cyclization. Furthermore, when the adhesive includes the curable component, such as a crosslinker, another heating step (the temperature is higher than the temperature of the step 112) can be performed additionally after the step 120 and before the step 130 to perform the cross-linking reaction. The specific temperature and time for generating the cross-linking reaction can be adjusted according to the type, the amount of the crosslinker.

Figure 3A:
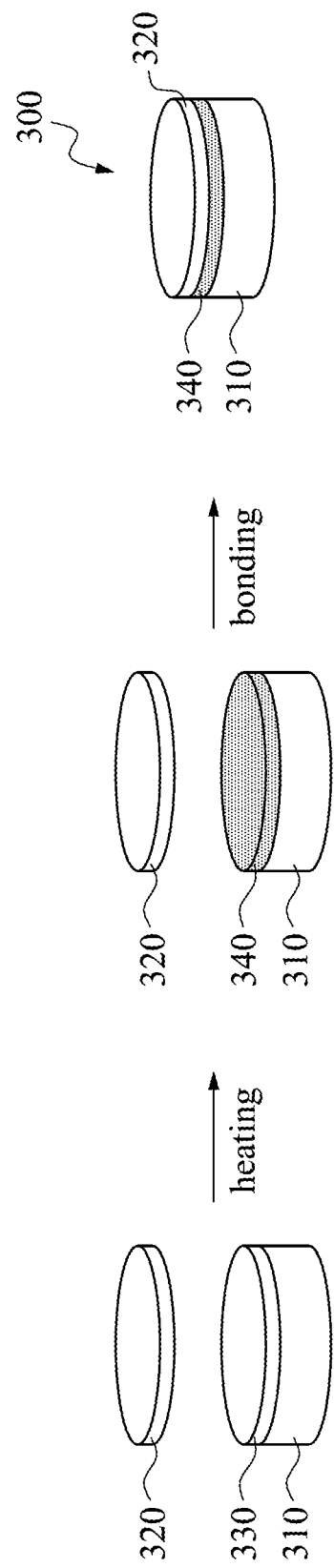
FIG. 3A is a schematic diagram of the step in FIG. 2.
Figure 3B:
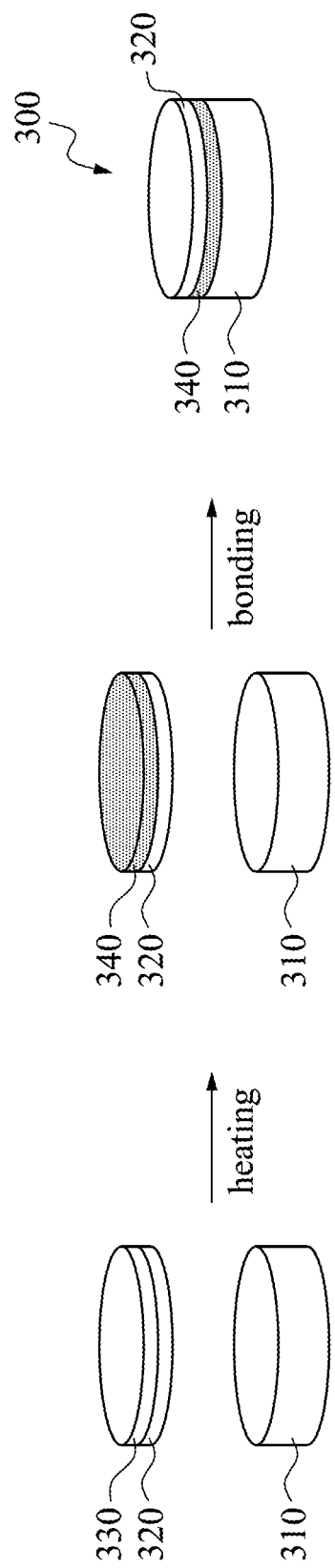
FIG. 3B is a schematic diagram of another step in FIG. 2.
Figure 3C:
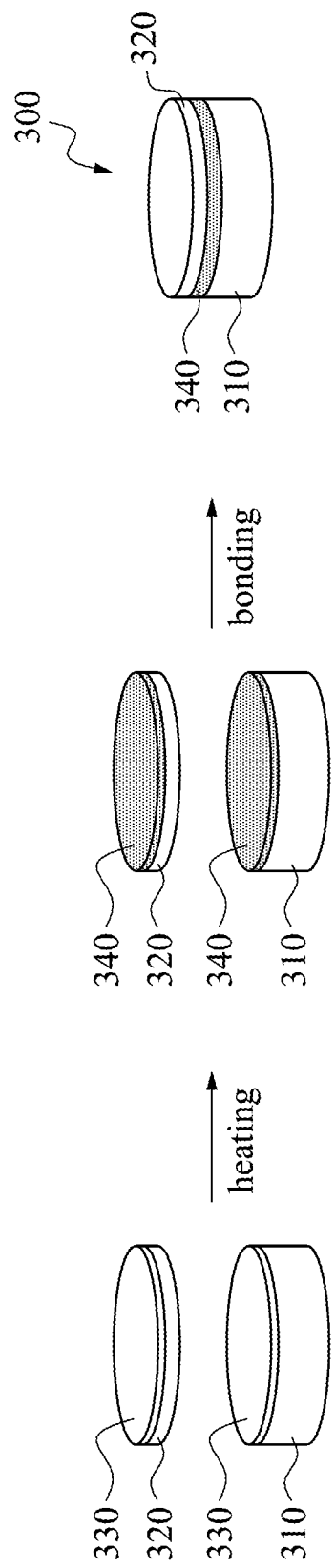
FIG. 3C is a schematic diagram of further another step in FIG. 2.

Please refer to FIGS. 3A, 3B, and 3C simultaneously. FIG. 3A is a schematic diagram of the step in FIG. 2. FIG. 3B is a schematic diagram of another step in FIG. 2. FIG. 3C is a schematic diagram of further another step in FIG. 2. As shown in FIG. 3A, when the step 111 is performed, the adhesive 330 can be coated on the surface (not labeled) of the substrate 310. Afterward, the step 112 is performed, the adhesive 330 is heated to convert the adhesive 330 into the adhesive layer 340. Then the bonding step is performed, the substrate 310 and the workpiece 320 are bonded by the adhesive layer 340 to form the joint structure 300. In FIG. 3B, the adhesive 330 is coated on the surface (not labeled) of the workpiece 320, and the workpiece 320 is turned over before performing the bonding step, so that the adhesive layer 340 faces the substrate 310 to form the joint structure 300. In FIG. 3C, the adhesive 330 is coated on the surface (not labeled) of the workpiece 320 and the surface (not labeled) of the substrate 310 simultaneously, and the workpiece 320 is turned over before performing the bonding step, so that the adhesive layer 340 of the workpiece 320 faces the adhesive layer 340 of the substrate 310 to form the joint structure 300. The remaining details of FIG. 3B and FIG. 3C can be the same as those of FIG. 3A, and it will not be described herein.

Figure 4:
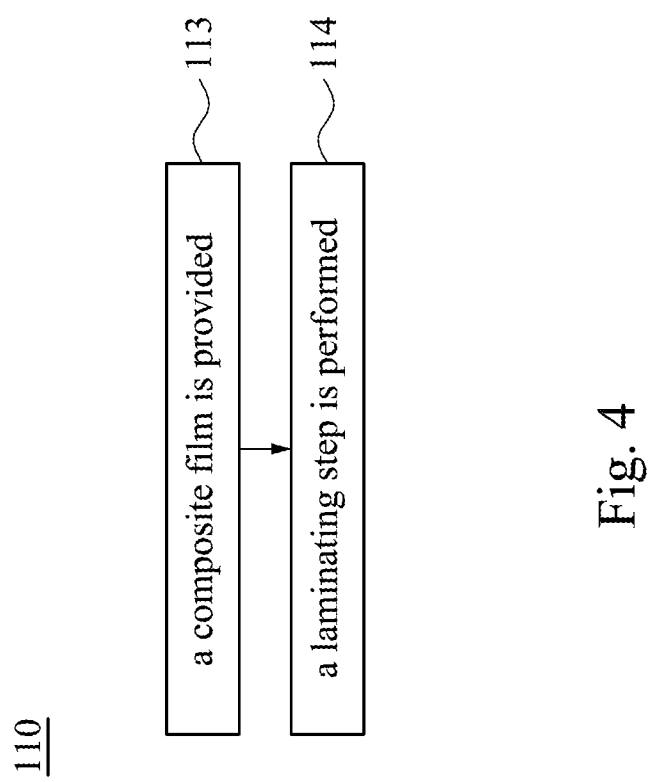
FIG. 4 is a flow chart of the step 110 in FIG. 1 according to another embodiment of the present disclosure.

Please refer to FIG. 4, which is a flow chart of the step 110 in FIG. 1 according to another embodiment of the present disclosure. In FIG. 4, the step 110 includes a step 113 and a step 114.

In the step 113, a composite film is provided, wherein the composite film includes a detachable substrate and an adhesive film, the adhesive film is disposed on a surface of the detachable substrate, and the adhesive film is obtained by the adhesive coated on the surface of the detachable substrate and then dried, the adhesive film of the composite film can be debonded. The detachable substrate includes but not limited to a synthetic resin film with the film thickness of 15

μm to 200 μm, such as polyethylene terephthalate (PET), polyethylene, polypropylene, polycarbonate or polyvinyl chloride. The method of coating includes but not limited to the spin coating, the slit coating, the bar coating and the screen printing, etc. The aforementioned drying can be performed at the temperature of 50° C. to 200° C. for 1 minute to 60 minutes. The main purpose of drying is removing some or all solvents of the adhesive. Therefore, as long as the aforementioned purpose can be achieved, the temperature and the time of drying can be adjusted appropriately according to the actual demands such as the type of solvent and the amount of solvent.

In the step 114, a laminating step is performed, wherein the surface of the substrate and/or the workpiece is contacted with the adhesive film of the composite film and heated so as to transfer the adhesive film to the surface of the substrate and/or the workpiece and convert into the adhesive layer. The step 114 can be heated at the temperature of 50° C. to 200° C. with rolling or vacuum thermal compression bonding, so that the adhesive film is transferred to the surface of the substrate and/or the workpiece. After the detachable substrate is removed, the step 114 is heated continuously at the temperature of 50° C. to 200° C. for 0.5 hours to 2 hours to remove the residual solvent, the adhesive film is converted into the adhesive layer, and then performed the bonding step. The main purpose of heating in the step 114 is softening the adhesive film to favorable for transferring. Therefore, as long as the aforementioned purpose can be achieved, the temperature and the time of heating can be adjusted appropriately according to the actual demands such as the type of solvent, the amount of solvent and the degree of cyclization.

Figure 5:
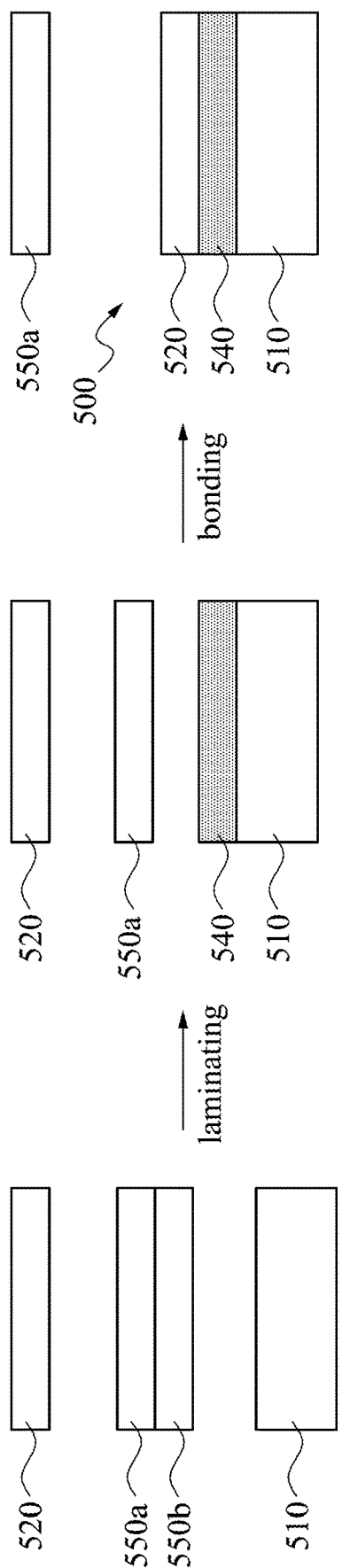
FIG. 5 is a schematic diagram of the step in FIG. 4.

Please refer to FIG. 5 simultaneously, which is a schematic diagram of the step in FIG. 4. As shown in FIG. 5, a composite film (not labeled) is provided in the step 113. The composite film includes the detachable substrate 550a and the adhesive film 550b, the adhesive film 550b is obtained by the adhesive (not shown) coated on the surface (not labeled) of the detachable substrate 550a and then dried. Then, the step 114 is performed, wherein the surface (not labeled) of the substrate 510 is contacted with the adhesive film 550b of the composite film and heated, so as to transfer the adhesive film 550b to the surface of the substrate 510. After the detachable substrate 550a is removed, the step 114 is heated continuously to remove the residual solvent, and the adhesive film 550b is converted into the adhesive layer 540, then the bonding step is performed to bond the substrate 510 and the workpiece 520 by the adhesive layer 540 to form the joint structure 500. In FIG. 5, the adhesive film 550b is transferred on the substrate 510. However, the present disclosure is not limited thereto. In the practice, the adhesive film 550b can be transferred on the workpiece 520, or the adhesive film 550b can be transferred on the substrate 510 and the workpiece 520 simultaneously, and then the bonding step is performed. Furthermore, in FIG. 5, the number, the shape, and the size of the substrate 510 and the workpiece 520 are merely example, and the present disclosure is not limited thereto.

Figure 6:
FIG. 6A is a side schematic view of a joint structure according to one embodiment of the present disclosure.
FIG. 6B is a side schematic view of a joint structure according to another embodiment of the present disclosure.

Please refer to FIGS. 6A and 6B, FIG. 6A is a side schematic view of a joint structure 600a according to one embodiment of the present disclosure. FIG. 6B is a side schematic view of a joint structure 600b according to another embodiment of the present disclosure. In FIG. 6A, the joint structure 600a includes a substrate 610a and two workpieces 620a. The substrate 610a and the workpieces 620a are bonded by the adhesive film 640a. In the present embodiment, the number of the substrate 610a and the workpieces 620a is the one-to-many relationship. In FIG. 6B, the joint structure 600b includes two substrates 610b and a workpiece 620b. The substrates 610b and the workpiece 620b are bond by the adhesive film 640b. In the present embodiment, the number of the substrates 610b and the workpieces 620b is the many-to-one relationship.

As shown in FIGS. 3A, 3B, 3C, 5, 6A, and 6B, in the present disclosure, the number of the substrate and the workpiece can be in the one-to-one relationship, the one-to-many relationship or the many-to-one relationship. Furthermore, in FIGS. 3A, 3B, 3C, 5, 6A, and 6B, the number, the shape, and the size of the substrate and the workpiece are merely example, and the present disclosure is not limited thereto.

Figure 7:
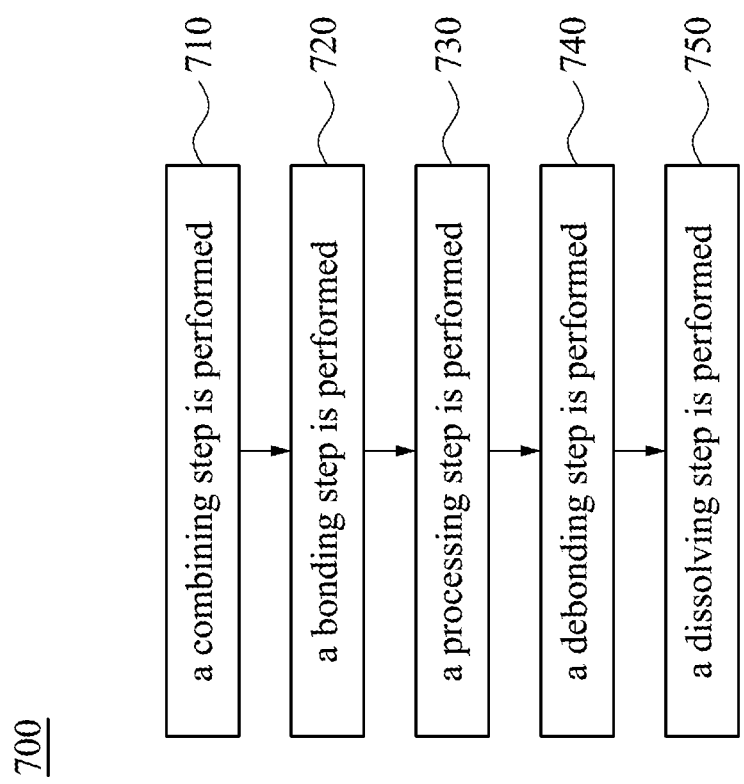
FIG. 7 is a flow chart of a method for temporary bonding workpiece according to another embodiment of the present disclosure.

Please refer to FIG. 7, which is a flow chart of a method for temporary bonding workpiece 700 according to another embodiment of the present disclosure. As shown in FIG. 7, the method for temporary bonding workpiece 700 includes a step 710, a step 720, a step 730, a step 740 and a step 750.

The step 710 is for performing a combining step, the step 720 is for performing a bonding step, the step 730 is for performing a processing step, the step 740 is for performing a debonding step. The step 710 to the step 740 can refer to the related descriptions of the step 110 to the step 140 in FIG. 1, and it will not be described herein.

In the step 750, a dissolving step is performed, wherein the adhesive layer remaining on the workpiece is dissolved and removed by a cleaning solvent after the debonding step. The solubility parameter (SP) of the cleaning solvent can range from 9.6 to 12.8. Therefore, it is favorable for dissolving and removing the adhesive after the laser irradiation. The cleaning solvent that can be used can be but is not limited to N, N-diethyl formamide (DEF, SP value is 9.6), cyclohexanone (SP value is 9.6), N-methyl pyrrolidinone (NMP, SP value is 11.2) or gamma-butyl lactone (GBL, SP value is 12.8).

A Method for Preparing the Polymer

The polymer of the adhesive according to the present disclosure is polyimide or a copolymer of amic acid/imide. The polymer can be performed the polycondensation reaction in the organic solvent by using a diamine and a dianhydride as reactant, and stirred at the temperature of 25° C. to 50° C. for 8 hours to 12 hours to obtain a reaction solution containing polyamic acid, wherein the polycondensation reaction is adjusted according to the amount of the reaction. The aforementioned reaction solution containing polyamic acid can be performed the dehydration ring-closure reaction by using the thermal cyclization or the chemical cyclization (adding pyridine or acetic anhydride). For example, the thermal cyclization can be performed by adding toluene to azeotropic removal of water. According to one embodiment of the present disclosure, toluene is added and performed the reflux dehydration ring-closure reaction at the temperature of 120° C. to 150° C. for 3 hours to 6 hours to obtain a reaction solution containing polyimide or the copolymer of amic acid/imide. The cyclization ratio of the copolymer of amic acid/imide is greater than or equal to 90%. Finally, toluene is distilled by the aforementioned reaction solution of polyimide or the copolymer of amic acid/imide, and the solid content is adjusted by the reduced pressure distillation or adding the organic solvent to obtain the solution of polyimide or the copolymer of amic acid/imide.

The aforementioned ratio relationship of the diamine and the dianhydride is based on the acid anhydride group content of dianhydride is 1 equivalent. Preferably, the amine group content of diamine is in the range of 0.5 to 2 equivalents. More preferably, the amine group content of diamine is in the range 0.7 to 1.5 equivalents. The aforementioned diamine and/or dianhydride can include the hydroxyl-containing unit, and can include the aliphatic ether-containing unit and/or the siloxane-containing unit. Therefore, the content of the hydroxyl-containing unit of the skeleton of the polymer is in the range of 5 wt % to 45 wt %, and the content of the aliphatic ether-containing unit and/or the siloxane-containing unit of the skeleton of the polymer is in the range of 5 wt % to 40 wt %. Furthermore, the aforementioned dehydration ring-closure reaction is conventional in the field, and will not be described herein.

The aforementioned organic solvent is used to dissolve the reactants and the products, includes the organic solvent having the better solubility and the organic solvent having the poor solubility. The organic solvent having the better solubility includes but not limited to N-methylpyrrolidone, N, N-dimethylformamide, N, N-dimethylacetamide, N-methylcaprolactam, dimethyl sulfoxide, tetramethylurea, hexamethyl phosphoramide, γ-butyrolactone, and pyridine. The organic solvent having the poor solubility includes but not limited to methanol, ethanol, isopropanol, n-butanol, cyclohexanol, ethylene glycol, ethylene glycol monomethyl ether, ethylene glycol monoethyl ether, ethylene glycol monobutyl ether, ethylene glycol dimethyl ether, ethylene glycol diethyl ether, diethyl ether, acetone, methyl ethyl ketone, cyclohexanone, methyl acetate, ethyl acetate, tetrahydrofuran, dichloromethane, chloroform, 1,2-dichloroethane, benzene, toluene, xylene, n-hexane, n-heptane and n-octane. The aforementioned organic solvents can be used singly or mixed two or more. Since the organic solvent is used to dissolve the reactants and the products, thus, any organic solvent that can dissolve the reactants and the products can be used, but is not limited to the above.

A Method for Preparing the Adhesive

The adhesive according to the present disclosure, which includes the polymer, the light absorbing material and the solvent. Further, the adhesive can selectively include an additive.

The polymer solution, the light absorbing material and the solvent are mixed, the additive is added selectively and mixed evenly to form the adhesive. The temperature of preparing the adhesive can range from the room temperature to 200° C. The content of the solid component (hereinafter referred to as the solid content) of the adhesive can be adjusted according to the viscosity and the volatility, the adhesive can include the solid content of 10 wt % to 60 wt %. In addition, the solid content is based on 100 wt %, the content of the solid component of the aforementioned polymer is 50 wt % to 98 wt %, and the content of the solid component of the light absorbing material is 2 wt % to 50 wt %.

The solvent can be used for the adhesive can be the organic solvent. The organic solvent can be included but not limited to N-methylpyrrolidone, N, N-dimethylformamide, N, N-dimethylacetamide, N-methylcaprolactam, dimethyl sulfoxide, γ-butyrolactone, γ-butyrolactam, ethylene glycol monomethyl ether, ethylene glycol monoethyl ether, ethylene glycol mono-n-propyl ether and ethylene glycol monobutyl ether, etc. The aforementioned solvents can be used for mixing two or more. In addition, the solvent that can dissolve the polymer or the solvent that mixing two or more can be used as the solvent of the present disclosure.

The additive can be used for the adhesive can be included but not limited to the crosslinker, the organic siloxane compound or the epoxy compound.

The Evaluation Method

The laminating ability: after laminating at the temperature of 120° C. and the pressure of 1 kgf/cm$^2$, the surface is flat and flawless indicated that great, greater than or equal to 90% of the surface is flat indicated that good, less than 90% of the surface is flat indicated that poor.

The solubility of the 30 wt % solid content: the appearance of the adhesive is clear and transparent indicated that great, the appearance is slight mist indicated that good, and the appearance is clearly precipitate indicated that poor.

The thermal compression bonding adhesion at 200° C.: the adhesion of the room temperature is greater than or equal to 10 N/cm$^2$ indicated that great, the adhesion of the room temperature is less than 10 N/cm$^2$ indicated that poor.

The overflow situation at 260° C.: observing the overflow situation of the joint structure, the overflow situation is recorded as yes, and the overflow situation is not recorded as no.

The laser debonding ability: irradiating the adhesive layer with the laser until the debond occurred, the cumulative laser power is greater than or equal to 2 W and less than 5 W indicated that great, the cumulative laser power is greater than or equal to 5 W and less than 8 W indicated that good, and the cumulative laser power is greater than 8 W indicated that poor.

The washability: after the laser debond, the workpiece is cleaned by the cleaning solvent. If the cleaning time is less than or equal to 10 minutes indicated that great, if the cleaning time is great than 10 minutes and less than or equal to 30 minutes indicated that good, and if the cleaning time is great than 30 minutes indicated that poor.

Example/Comparative Example

The diamine used in Example/Comparative Example is shown in Table 1. In Table 1, the trade name of diamine (a-3) is PAM-E, which is bought from Shin-Etsu Chemical Co., Ltd. The viscosity (25° C.) of the diamine (a-3) is 4 mm$^2$/s, the specific gravity (25° C.) of the diamine (a-3) is 0.9, and the functional group equivalent weight (FGEW) of the diamine (a-3) is 130 g/mole. $R^2$ and n2 are in accordance with the product specifications. The trade name of the diamine (a-4) is JEFFAMINE-D400, which is bought from Huntsman Corporation. The average molecular weight of the diamine (a-4) is about 430, and m3 is in accordance with the product specifications.

TABLE 1

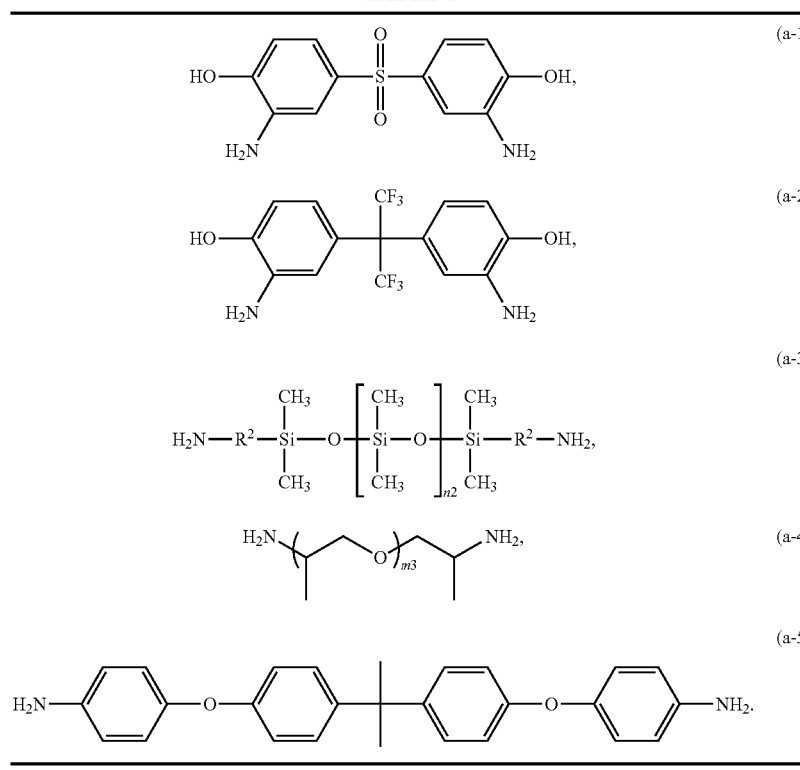

The dianhydride used in Example/Comparative Example is shown in Table 2. In Table 2, the trade name of the dianhydride (b-3) is X22-168AS, which is bought from Shin-Etsu Chemical Co., Ltd. The viscosity (25° C.) of the dianhydride (b-3) is 160 mm²/s, the specific gravity (25° C.) of the dianhydride (b-3) is 1.03, and the functional group equivalent weight (FGEW) of the dianhydride (b-3) is 500 g/mole. $R^3$ and n3 are in accordance with the product specifications.

TABLE 2

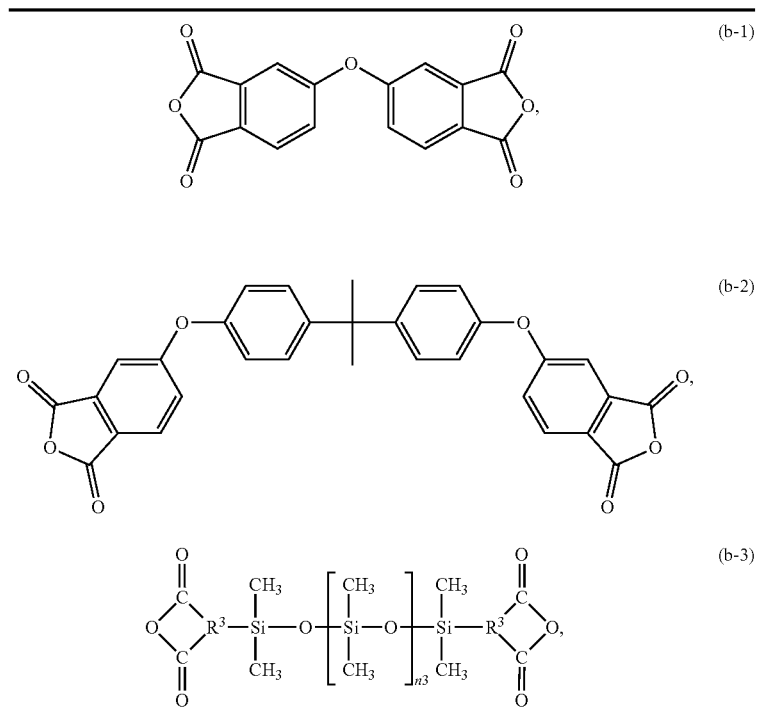

TABLE 2-continued

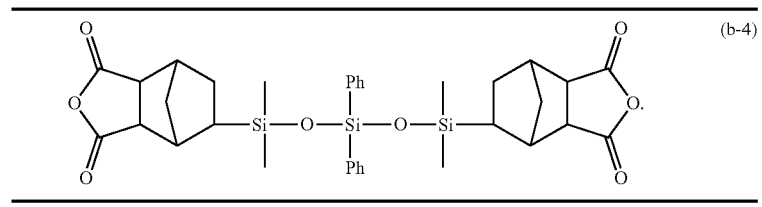

The light absorbing material used in Example/Comparative Example is carbon black, which is bought from Daxin Materials Co., Ltd. The trade name of carbon black is PK-127, and the average particle diameter of carbon black is 120 nm.

The diamine and the dianhydride are sequentially added to the solvent according to the ratio shown in Table 3, so as to prepare the copolymer solution of amic acid/imide or the polyimide solution. The solid content of the copolymer solution of amic acid/imide or the polyimide solution is 20 wt %. Specifically, the diamine and the dianhydride are performed the polycondensation reaction in the organic solvent according to the ratio shown in Table 3, adjusted according to the amount of the reaction, and stirred at the temperature of 25° C. to 50° C. for 8 hours to 12 hours to obtain a reaction solution containing polyamic acid. Toluene is added to the aforementioned reaction solution containing polyamic acid and performed the reflux dehydration ring-closure reaction at the temperature of 120° C. to 150° C. for 3 hours to 6 hours to obtain a reaction solution containing polyimide or the copolymer of amic acid/imide. The cyclization ratio of the copolymer of amic acid/imide is greater than or equal to 90%. Finally, toluene is distilled by the aforementioned reaction solution of polyimide or the copolymer of amic acid/imide, and the solid content is adjusted by the reduced pressure distillation or adding the organic solvent to obtain the solution of polyimide or the copolymer of amic acid/imide. The solid content of the polyimide solution or the copolymer of amic acid/imide solution is 20 wt %.

Further, the type of the organic solvent and the content of the light absorbing material are according to Table 3 (the content of the light absorbing material in Table 3 is the weight percentage of the light absorbing material to the solid content of the adhesive) to prepare the adhesive, and the solid content of the adhesive is 30 wt %. The adhesive is coated on the surface of the substrate to form the adhesive layer. Then, the workpiece is placed on the substrate which has the adhesive layer to perform the bonding step to obtain the joint structure of Example/Comparative Example. Or the adhesive of the present disclosure is coated on the detachable substrate to form the composite film including the adhesive film, and then performing the laminating step to heat the adhesive film for transferring to the substrate at the temperature of 50° C. to 200° C. After the detachable substrate is removed, the substrate is heated at the temperature of 50° C. to 200° C. for 0.5 hours to 2 hours to remove the residual solvent to obtain the substrate which has the adhesive film. Then, the workpiece is placed on the substrate which has the adhesive layer to perform the bonding step to obtain the joint structure of Example/Comparative Example.

TABLE 3

| component | Example 1 | Example 2 | Example 3 | Example 4 |
|---|---|---|---|---|
| dianhydride | (b-1)/(b-4) | (b-1)/(b-4) | (b-1)/(b-3) | (b-1)/(b-4) |
| molar ratio | 90/10 | 65/35 | 90/10 | 90/10 |
| diamine | (a-5)/(a-1) | (a-5)/(a-2) | (a-5)/(a-2) | (a-5)/(a-2) |
| molar ratio | 50/50 | 50/50 | 50/50 | 70/30 |
| hydroxyl containing unit | 18 wt % | 20 wt % | 22 wt % | 13 wt % |
| aliphatic ether containing unit/ siloxane containing unit | 8 wt % | 22 wt % | 11 wt % | 7 wt % |
| cyclization ratio | 90% | 94% | 93% | 95% |
| organic solvent type | GBL | GBL | GBL | DEF |
| light absorbing material | 7 wt % | 15 wt % | 7 wt % | 7 wt % |

| component | Example 5 | Example 6 | Example 7 | Example 8 |
|---|---|---|---|---|
| dianhydride | (b-1) | (b-1) | (b-2) | (b-2) |
| molar ratio | 100 | 100 | 100 | 100 |
| diamine | (a-4)/(a-3)/(a-2) | (a-4)/(a-2) | (a-3)/(a-2) | (a-4)/(a-2) |
| molar ratio | 40/30/30 | 70/30 | 30/70 | 30/70 |
| hydroxyl containing unit | 15 wt % | 14 wt % | 27 wt % | 26 wt % |
| aliphatic ether containing unit/ siloxane containing unit | 34 wt % | 39 wt % | 8 wt % | 13 wt % |
| cyclization ratio | 92% | 97% | 95% | 94% |
| organic solvent type | DEF | DEF | DEF | DEF |
| light absorbing material | 7 wt % | 43 wt % | 7 wt % | 29 wt % |

| component | Comparative Example 1 | Comparative Example 2 | Comparative Example 3 |
|---|---|---|---|
| dianhydride | (b-1) | (b-1) | (b-1) |
| molar ratio | 100 | 100 | 100 |
| diamine | (a-3)/(a-2) | (a-5) | (a-5)/(a-2) |
| molar ratio | 30/70 | 100 | 75/25 |
| hydroxyl containing unit | 36 wt % | 0 wt % | 12 wt % |
| aliphatic ether containing unit/ siloxane containing unit | 11 wt % | 0 wt % | 0 wt % |
| cyclization ratio | 96% | 92% | 93% |
| organic solvent type | DEF | DEF | DEF |
| light absorbing material | 0.1 wt % | 0 wt % | 7 wt % |

The evaluation of Example/Comparative Example is performed, such as the laminating ability, the solubility of the 30 wt % solid content, the thermal compression bonding adhesion at 200° C., the overflow situation at 260° C., the laser debonding ability, the washability, etc. The laser wavelengths used in Example/Comparative Example and the evaluation results are shown in Table 4.

TABLE 4

| Evaluation | Example 1 | Example 2 | Example 3 | Example 4 |
|---|---|---|---|---|
| laminating ability | ○ | ◎ | ○ | ○ |
| solubility of the 30 wt % solid content | ◎ | ◎ | ◎ | ◎ |
| thermal compression bonding adhesion at 200° C. | ◎ | ◎ | ◎ | ◎ |
| overflow situation at 260° C. | no | no | no | no |
| laser debonding ability | ○ | ○ | ○ | ○ |
| laser wavelengths (nm) | 355 | 355 | 355 | 355 |
| washability | ◎ | ◎ | ◎ | ◎ |

| Evaluation | Example 5 | Example 6 | Example 7 | Example 8 |
|---|---|---|---|---|
| laminating ability | ◎ | ○ | ◎ | ○ |
| solubility of the 30 wt % solid content | ◎ | ◎ | ◎ | ◎ |
| thermal compression bonding adhesion at 200° C. | ◎ | ◎ | ◎ | ◎ |
| overflow situation at 260° C. | no | no | no | no |
| laser debonding ability | ◎ | ◎ | ○ | ○ |
| laser wavelengths (nm) | 532 | 355 | 355/1064 | 355/1064 |
| washability | ◎ | ◎ | ◎ | ◎ |

| Evaluation | Comparative Example 1 | Comparative Example 2 | Comparative Example 3 |
|---|---|---|---|
| laminating ability | ◎ | X | X |
| solubility of the 30 wt % solid content | ◎ | X | ○ |
| thermal compression bonding adhesion at 200° C. | ◎ | X | X |
| overflow situation at 260° C. | no | — | — |
| laser debonding ability | X | — | — |
| laser wavelengths (nm) | 355/1064 | — | — |
| washability | ◎ | X | ○ |

Note:
"◎" means great, "○" means good, "X" means poor, "—" means not tested.

Note:
The laser wavelength (nm) used is "355/1064", which means that 355 nm and 1064 nm are applicable wavelengths. It can be debonded by the laser with the wavelength of 355 nm independently, or can be debonded by the laser with the wavelength of 1064 nm independently.

As shown in Table 4, the method for temporary bonding workpiece according to the present disclosure, the laminating ability of each example is great or good. The solubility of the 30 wt % solid content of each example is great or good. The thermal compression bonding adhesion at 200° C. of each example is great or good. The overflow situation at 260° C. of the joint structure is no. The laser debonding ability of the joint structure is great or good. The washability of the joint structure is great. It is shown that the adhesive of the present disclosure has the excellent adhesion, the heat resistance and the removability, which is favorable for the application of the temporary bonding/debonding technique.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A method for temporary bonding workpiece, comprising:
    performing a combining step, wherein an adhesive layer is formed on a surface of at least one substrate and/or at least one workpiece;
    performing a bonding step, wherein the substrate and the workpiece are bonded by the adhesive layer;
    performing a processing step, wherein the workpiece is processed; and
    performing a debonding step, wherein the adhesive layer is irradiated with a laser so as to separate the workpiece from the substrate;
    wherein the adhesive layer is formed by an adhesive, the adhesive comprises a polymer and a light absorbing material, a content of the polymer in a solid content of the adhesive is in a range of 50 wt % to 98 wt %, a content of the light absorbing material in the solid content of the adhesive is in a range of 2 wt % to 50 wt %, the polymer is polyimide or a copolymer of amic acid/imide, a content of a hydroxyl-containing unit of a skeleton of the polymer is in a range of 5 wt % to 45 wt %, a content of an aliphatic ether-containing unit or a siloxane-containing unit of the skeleton of the polymer is in a range of 5 wt % to 40 wt %, and a cyclization ratio of the polymer is greater than or equal to 90%.

2. The method for temporary bonding workpiece of claim 1, wherein the combining step comprises:
    performing a coating step, wherein the adhesive is coated on the surface of the substrate and/or the workpiece; and
    performing a heating step, wherein the adhesive is heated so as to convert the adhesive into the adhesive layer.

3. The method for temporary bonding workpiece of claim 1, wherein the combining step comprises:
    providing a composite film, wherein the composite film comprises a detachable substrate and an adhesive film, the adhesive film is disposed on a surface of the detachable substrate, and the adhesive film is obtained by the adhesive coated on the surface of the detachable substrate and then dried; and
    performing a laminating step, wherein the surface of the substrate and/or the workpiece is contacted with the adhesive film of the composite film and heated so as to transfer the adhesive film to the surface of the substrate and/or the workpiece and convert into the adhesive layer.

4. The method for temporary bonding workpiece of claim 1, further comprises:
    performing a dissolving step, wherein the adhesive layer remained on the workpiece is dissolved and removed by a cleaning solvent after the debonding step.

5. The method for temporary bonding workpiece of claim 4, wherein the solubility parameter of the cleaning solvent ranges from 9.6 to 12.8.

6. The method for temporary bonding workpiece of claim 1, wherein the workpiece is a chip, a wafer or a micro device for semiconductor manufacturing.

7. The method for temporary bonding workpiece of claim 1, wherein the aliphatic ether-containing unit is a poly aliphatic ether unit.

8. The method for temporary bonding workpiece of claim 1, wherein the siloxane-containing unit is a polysiloxane unit.

9. The method for temporary bonding workpiece of claim 1, wherein the light absorbing material is carbon black, titanium black, iron oxide, titanium nitride, an organic pigment or a dye.

10. An adhesive, comprising:
a polymer, wherein a content of the polymer in a solid content of the adhesive is in a range of 50 wt % to 98 wt %, the polymer is polyimide or a copolymer of amic acid/imide, a content of a hydroxyl-containing unit of a skeleton of the polymer is in a range of 5 wt % to 45 wt %, a content of an aliphatic ether-containing unit or a siloxane-containing unit of the skeleton of the polymer is in a range of 5 wt % to 40 wt %, and a cyclization ratio of the polymer is greater than or equal to 90%; and
a light absorbing material, wherein a content of the light absorbing material in the solid content of the adhesive is in a range of 2 wt % to 50 wt %.

11. The adhesive of claim 10, wherein the hydroxyl-containing unit comprises a structure represented by formula (I-1), formula (I-2), formula (I-3), formula (I-4) or formula (I-5):

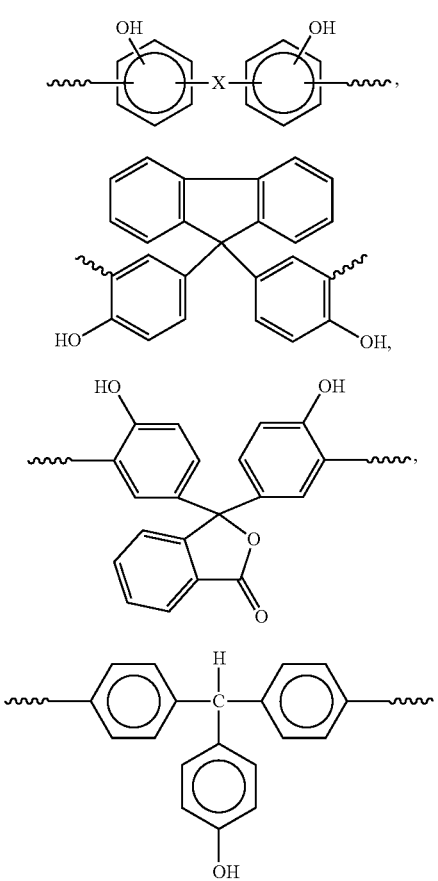

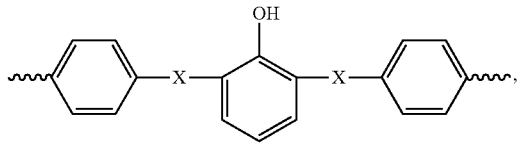

in formula (I-1) and formula (I-5), wherein each X is independently a single bond or a divalent organic group.

12. The adhesive of claim 11, wherein each X is independently the single bond, a alkylene group of 1 to 4 carbon atoms, —CO—, —COO—, —O—, —SO$_2$— or C(CF$_3$)$_2$.

13. The adhesive of claim 10, wherein the aliphatic ether-containing unit is a poly aliphatic ether unit.

14. The adhesive of claim 13, wherein the poly aliphatic ether unit comprises a segment represented by formula (II-1) or formula (II-2):

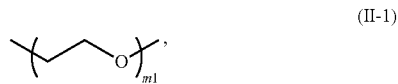

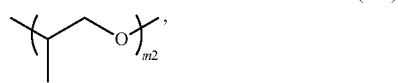

wherein m1 is an integer from 1 to 22, and m2 is an integer from 1 to 22.

15. The adhesive of claim 10, wherein the siloxane-containing unit is a polysiloxane unit.

16. The adhesive of claim 15, wherein the polysiloxane unit comprises a segment represented by formula (III-1):

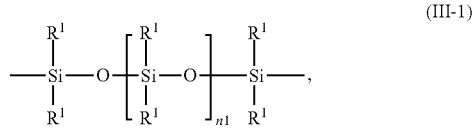

wherein each R$^1$ is independently a methyl or a phenyl, n1 is an integer from 0 to 5.

17. The adhesive of claim 10, wherein the light absorbing material is carbon black, titanium black, iron oxide, titanium nitride, an organic pigment or a dye.

* * * * *